United States Patent [19]

Haws et al.

[11] 4,044,396
[45] Aug. 23, 1977

[54] HEAT PIPE COOLING OF AIRBORNE PHASED ARRAY RADAR

[75] Inventors: James L. Haws; Douglas W. Quinney, both of Plano; Frank A. Richards, Dallas, all of Tex.

[73] Assignee: The United States of America as represented by the Secretary of the Air Force, Washington, D.C.

[21] Appl. No.: 604,530

[22] Filed: Aug. 14, 1975

[51] Int. Cl.² ............................................. H05K 7/20
[52] U.S. Cl. .................................. 361/385; 361/388; 165/80; 174/15 HP
[58] Field of Search .................... 165/80, DIG. 3, 108, 165/106, 105; 174/15 R, 15 HP; 317/100; 357/28; 219/209

[56] References Cited

U.S. PATENT DOCUMENTS

| 2,890,863 | 6/1959 | Scal | 165/DIG. 3 |
|---|---|---|---|
| 2,992,372 | 7/1961 | Himeon | 165/DIG. 3 |
| 3,248,636 | 4/1966 | Colaiaco | 165/DIG. 3 |
| 3,440,407 | 4/1969 | Goltsos | 219/209 |
| 3,651,865 | 3/1972 | Feldmanis | 317/100 |
| 3,788,393 | 1/1974 | Plizak | 317/100 |
| 3,887,785 | 6/1973 | Ahlport | 219/209 |

FOREIGN PATENT DOCUMENTS 791,491  3/1958  United Kingdom .......... 165/DIG. 3

OTHER PUBLICATIONS

Counter-Flow Cooling System, Chu, IBM Tech. Discl. Bulletin, vol. 8, No. 11, Apr. 1966, p. 1692.

Primary Examiner—Gerald P. Tolin
Attorney, Agent, or Firm—Joseph E. Rusz; Henry S. Miller

[57] ABSTRACT

A system for controlling temperature in phased array radar modules where a combination support plate-heat exchanger allows a cooling fluid to circulate therethrough and a heat pipe extends the length of the module and into the support plate-heat exchanger where heat is taken to a remote heat exchanger. Heating elements are attached to the support plate-heat exchanger to facilitate initial system warmup.

3 Claims, 1 Drawing Figure

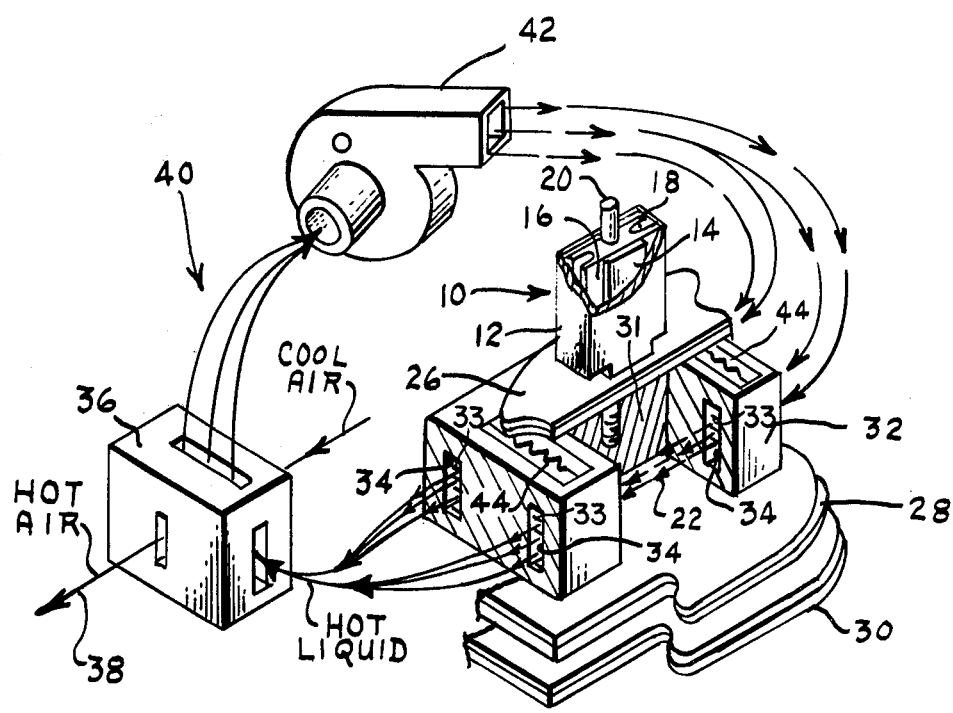

HEAT PIPE COOLING OF AIRBORNE PHASED ARRAY RADAR

STATEMENT OF GOVERNMENT INTEREST

The invention described herein may be manufactured and used by or for the Government for governmental purposes without the payment of any royalty thereon.

BACKGROUND OF THE INVENTION

This invention relates generally to airborne phased array radar and more particularly to a system for controlling array transmitter-receiver microwave module temperature in the radar.

A phased array radar is made of many transmitter-receiver microwave modules, each having at least one antenna. When these antennas are grouped together, they form a planar antenna array. The radar beam is electronically scanned by varying the signal phase from module to module. The RF, IF and DC signals are supplied to and received from the modules by electrical distribution manifolds on the end of the module opposite the antenna.

In addition to the antenna, each module is made up of thin film microwave integrated transmitter and receiver circuitry consisting of solid-state power amplifiers, frequency multipliers, low noise amplifiers and phasors. Present state-of-the-art yields microwave devices with inherently low efficiencies, hence each device within the circuit dissipates power in the form of heat.

Various system considerations constrain the design of the radar array thermal control system. For example, low device junction temperatures are required for reliability. In addition, state-of-the-art circuit design requires a constant temperature be maintained for proper circuit operation, since many module properties, including phase, change with temperature. It is easily recognized that if each module assumed a different temperature, and thus different phase, relative to the surrounding modules that it would be impossible to predict system performance, since performance is phase dependent.

Perhaps the most critical problem in the design and operation of a phased array, is the removal of a vast amount of heat from a small volume. This of course results from the inherent nature of the device in having a large number of inefficient modules confined to a relatively small volume. In removing this heat, it is necessary to maintain a low electronic device temperature to obtain a high system reliability. Also a low temperature gradient must be maintained within the module and from module to module, since the module electrical parameters are temperature dependent. Further, the average value of the array temperature must be controlled since the modules function properly over a small temperature band, thus necessitating on occasion, the need to add heat prior to initially energizing the system to insure that it has reached operating temperature.

SUMMARY OF THE INVENTION

The present invention is directed to solving the aforementioned problems of the prior art. In accordance with criteria used for the application of devices for airborne operation any system must be low cost, light weight, small in volume and consume a minimum amount of power. It must also fit into the physical constraints imposed by the module and array, recognizing that array size is dictated by aircraft configuration. Room must be provided in which to mount the circuits. In addition, the cooling system must not interfere with DC, RF, and IF electrical connectors, antenna patterns, module tie down, module removal and other similar limitations placed upon airborne equipment.

Various methods have been tried aimed at solving the problem, however, thus far none have proven satisfactory. For example, an obvious answer would be the application of cooling air to the modules. This is satisfactory in low power applications, but becomes unfeasible as module heat dissipations increase due to the large corrective temperature rise and amount of power required to supply the large volume of air needed. Further, air cooling makes temperature control and module warmup of the array difficult.

If air is replaced with a circulating fluid or a circulating refrigerant, the problem of maintainability arises, inasmuch as frequently a set of "cold plates" to which several modules are attached is used requiring that a large number of modules be serviced at one time, along with the added weight of the cold plate to the system. An alternative solution is to enclose the fluid in a bellows arrangement whereby the bellows expand to make thermal contact with the modules as the fluid is circulated. However, such a system is limited by manufacturing complexity and cost.

The instant invention solves the problem of prior art and remains within the restraints set down for airborne applications. A module is constructed with a connector on the bottom which will engage with connectors on the RF, IF and DC electrical signal manifolds. A support structure is provided for the modules and electrical signal manifolds. Heat is removed from the module by utilizing a heat pipe positioned in the center of the module with circuits placed on both sides of it. The heat pipe runs past the module connector and through the electrical signal manifolds to the liquid cooled support structure. The support structure provides mechanical support to the modules and also serves as a heat exchanger. A remote liquid heat exchanger is provided external to the radar array so that it may assume an optimum heat transfer configuration for any array heat loading since it is not required by the module configuration. Heaters may be added to the support structure-heat exchanger for warming the fluid and hence the module as required.

It is therefore an object of the invention to provide a new and improved system for controlling module temperature in phased array radars.

It is another object of the invention to provide a new and improved temperature controlling system that is lower in cost than currently available like systems.

It is a further object of the invention to provide a new and improved temperature controlling system that is light weight.

It is still another object of the invention to provide a new and improved system for controlling modules temperature in phase array radars that is small in volume.

It is still a further object of the invention to provide a new and improved temperature controlling system that consumes a minimum amount of power.

It is another object of the invention to provide a new and improved system for controlling temperature that is easily maintained.

It is another object of the invention to provide a new and improved temperature controlling system that may be used with phased array radars that are highly reliable.

It is another object of the invention to provide a new and improved system for controlling module temperature in phased array radars in an exceedingly uniform manner.

It is another object of the invention to provide a new and improved system for controlling temperature in airborne phased array radar modules that will not interfere with the connection and operation of the radar system.

These and other advantages, features and objects of the invention will become more apparent from the following description taken in connection with the illustrative embodiment in the accompanying drawing.

DESCRIPTION OF THE DRAWING

The FIGURE is a schematic representation of the system of the invention.

DESCRIPTION OF THE PREFERRED EMBODIMENT

Referring now to the FIGURE, there is shown an individual transmitter-receiver microwave module generally at 10. The module may be of the length necessary to perform the task but commonly approximate 6 inches long. A case 12 is shown cutaway exposing the circuits 14 mounted on a panel 16. Not shown are additional circuits mounted on the second panel 18. For convenience, the panels are joined and may in fact be fabricated from a single piece of stock. Passing between the panels is a heat pipe 20 which extends from the antenna end of the module through the module base and attached to the support plate-heat exchanger 32. Heat pipe 20 engages portion 31 of the support plate-heat excnahger 32 which is shown cut away but is cooled by the fluid passing on each side. The support plate-heat exchanger 32 is equipped with conventional heat exchange fins 33 to assure maximum heat transfer. The heat pipe is small, light weight, and not subject to fatigue, and will operate effectively in a dynamic environment. The connection between the module 10 and the DC electrical manifold 26 is not shown, nor is the connection with the RF and IF manifolds 28 and 30 respectively.

The support plate-heat exchanger 32 separates the DC manifold 26 from the RF and IF manifolds 28 and 30 respectively. Cooling fluid 22 flows through the finned openings 34 where heat transfer takes place via the heat pipe 20 and the support plate-heat exchanger 32.

In the normal cooling mode, the hot liquid 22 is sent to a separate remote heat exchanger 36 positioned in a convenient location where the heat is given off to the atmosphere shown by the arrow 38. The cool liquid 40 is then piped back to a recirculation pump 42 and thence returns to the support plate-heat exchanger 32.

In the event that it is necessary to heat the module prior to operation, electrical resistance heaters 44 mounted on the support plate-heat exchanger would be activated and in addition, the recirculation pump would be deactivated until operating temperature has been achieved.

Since the heat pipe extends axially through the module and has an inherently low axial temperature gradient, the overall temperature gradient within the module is reduced. The heat pipe characteristics are repeatable, thus aiding the maintenance of a module to module temperature gradient, and since it has a small effective thermal conductivity, it allows for simple array temperature control.

It should be understood, of course, that the foregoing disclosure relates to only a preferred embodiment of the invention and that numerous modifications or alterations may be made therein without departing from the spirit and scope of the invention as set forth in the appended claims.

What is claimed is:

1. A system for controlling temperature in individual miniature modules comprising: a module having a case forming an enclosure, a pair of parallel panels positioned in the case, electronic circuitry mounted on said panels between each panel and the case, and means mounted in juxtaposition and between said panels for heat transfer, said means extending beyond the limits of said case in at least one direction, forming an extension; a fluid heat transfer medium; means supporting said module and having said fluid medium pass therethrough and operatively associating with the heat transfer means extension, thereby removing heat from said module.

2. A system for controlling temperature according to claim 1 wherein said means for transfering heat is a heat pipe.

3. A system for controlling temperature according to claim 2 wherein the heat pipe attaches to a support plate-heat exchanger provided with a plurality of fins.

* * * * *